United States Patent
Ko et al.

(10) Patent No.: US 12,360,177 B2
(45) Date of Patent: *Jul. 15, 2025

(54) INTERACTIVE TEST EQUIPMENT FOR QUALITY EVALUATION OF POWER TRANSFORMER

(71) Applicant: Po-Cheng Ko, Taichung (TW)

(72) Inventors: Po-Cheng Ko, Taichung (TW);
Chun-Yao Ko, Taichung (TW);
Chih-Ting Ko, Taichung (TW)

(73) Assignee: Po-Cheng Ko, Taichung (TW)

( * ) Notice: Subject to any disclaimer, the term of this patent is extended or adjusted under 35 U.S.C. 154(b) by 388 days.

This patent is subject to a terminal disclaimer.

(21) Appl. No.: 17/931,907

(22) Filed: Sep. 14, 2022

(65) Prior Publication Data

US 2023/0104801 A1 Apr. 6, 2023

(30) Foreign Application Priority Data

Oct. 4, 2021 (TW) ................................. 110136915

(51) Int. Cl.
*G01R 31/62* (2020.01)
*G01R 27/02* (2006.01)
*G06Q 50/26* (2024.01)

(52) U.S. Cl.
CPC ............. *G01R 31/62* (2020.01); *G01R 27/02* (2013.01); *G06Q 50/265* (2013.01)

(58) Field of Classification Search
CPC .... G01R 31/62; G01R 27/02; G06Q 10/0639; G06Q 10/06395; G06Q 10/06398; G09B 3/00; G09B 3/02; G09B 5/00; G09B 7/00; G09B 7/02; G09B 9/00; G09B 25/00; G09B 25/02

See application file for complete search history.

(56) References Cited

U.S. PATENT DOCUMENTS

| 2017/0336462 A1* | 11/2017 | Kaufmann | ............. G01R 31/72 |
| 2023/0104141 A1* | 4/2023 | Ko | ..................... G01R 31/1272 324/551 |

FOREIGN PATENT DOCUMENTS

CN 103778827 A * 5/2014

OTHER PUBLICATIONS

Translation of CN-103778827-A, May 7, 2014.*

* cited by examiner

*Primary Examiner* — Manuel L Barbee
(74) *Attorney, Agent, or Firm* — Cheng-Ju Chiang

(57) ABSTRACT

An interactive test equipment for quality evaluation of power transformers includes at least a control unit, a test question type module and an operating module. The test question type module includes at least a test set, and each of the at least a test set has a transformer, a voltage value display and a resistance value display. Based on the above design, the voltage value display and the resistance value display of the each of the at least a test set can display a measured voltage value and a measured resistance value of wiring connection of a corresponding transformer. Test subjects can initiate the interactive test equipment and select answers through the operating module, and load questions and determine answers through the control unit. The interactive test equipment is used to authenticate and evaluate a judgment ability of the test subjects in order to ensure safety of a working environment.

9 Claims, 6 Drawing Sheets

INTERACTIVE TEST EQUIPMENT FOR QUALITY EVALUATION OF POWER TRANSFORMER

BACKGROUND OF THE INVENTION

Field of the Invention

The present invention relates to a test technical field of power using safety, particularly relates to an interactive test equipment for quality evaluation of power transformers. The interactive test equipment in accordance with the present invention is used to allow test subjects determining whether a transformer is in a good or poor condition through an interactive test method, and then to authenticate and evaluate a judgment ability of the test subjects in order for ensuring that the test subjects can immediately find out whether the transformer is normal in time.

Description of Related Art

"Electricity" which has been discovered and rapidly developed since the eighteenth century has brought huge changes to industry and society. While "electricity" brings convenience to people, there is also a risk of getting electric shocks and other risks for electricity use. Hence, no matter where places to use electricity are and what kinds of power related equipment, devices and parts, etc. are used, safety knowledge must be possessed and relevant laws and regulations must be followed in order to conveniently and safely use electricity. A transformer is an important electrical device, and is a device that applies Faraday's law of electromagnetic induction to increase or decrease voltages. The transformer usually contains two or more sets of coils. Main purposes of the transformer include raising or lowering voltages of alternating currents, changing impedances and separating circuits.

A transformer can change phases and voltages thereof through different wiring methods. Taking general households and workplaces as an example, a secondary side of a common transformer can be set as a three-phase three-wire voltage of 220V, three-phase four-wire voltages of 120V and 208V, three-phase four-wire voltages of 110V and 190V, single-phase three-wire voltages of 220V and 110V, and a single-phase two-wire voltage of 110V. However, when the transformer has breakdowns such as a wiring error or disconnection, etc., a dangerous situation may occur. As a result, not only energy waste is caused and related electrical equipment is damaged, but also human bodies and properties are even endangered.

Since overall safety of electricity use is directly affected by the fact whether transformers are normally operated, in order to avoid danger of the aforementioned transformer failure, factory personnel must regularly or irregularly examine wiring of a transformer to determine whether any breakdown like disconnection occurs based on measuring voltage values between wiring connections of the transformer during a power inspection process. Ability of the factory personnel to judge quality of the transformer during testing becomes very important.

Therefore, in order to ensure that workers can immediately determine testing quality of all kinds of transformers based on voltage values measured between different wiring connections of these transformers during work, it is necessary to arrange regular or irregular return training and testing for the workers to ensure that they have a good judgment ability. However, existing test methods are proceeded for testing based on pre-edited test papers or preset transformers. Questions thereof are monotonous and their answers are fixed. As a result, tests based on them are not interactive and realistic. Taking tests becomes a superficial operation for the workers. Actual judgment ability of the workers by really testing transformers cannot be effectively understood.

In other words, a solution how to overcome shortcomings of the existing methods to use fixed test papers or transformers for testing, and how to make tests become more variable and interactive to have a reality simulation effect is highly expected by the related industry and is also intended to be researched through the present invention.

Hence, the inventors of the present invention deeply research problem of existing transformer tests. Based on many years of rich experience in research, development and manufacture in the related industry and after continuous hard working and effort of research and trial production, an interactive test equipment for quality evaluation of power transformers in accordance with the present invention is finally successfully developed to overcome trouble and inconvenience caused by deficiency of variety and interaction in the existing art.

BRIEF SUMMARY OF THE INVENTION

Accordingly, a main objective of the present invention is to provide an interactive test equipment for quality evaluation of power transformers. The interactive test equipment in accordance with the present invention is used to allow test subjects determining whether a transformer is in a good or poor condition through an interactive test method, and then to authenticate and evaluate a judgment ability of the test subjects.

In addition, another main objective of the present invention is to provide an interactive test equipment for quality evaluation of power transformers. The interactive test equipment in accordance with the present invention is used to ensure that the test subjects can instantly find out in time whether a wiring of the transformer is disconnected or out of order when they work in a construction site so as to ensure safety of a working environment.

Based on the above, the above mentioned objectives and effects of the present invention are physically fulfilled mainly through the following technical solutions. The interactive test equipment is disposed on a platform, and includes at least a control unit, a test question type module and an operating module.

The control unit is disposed to have data and instructions for processing the test question type module and the operating module, and to save different question types in order to load the different question types in the test question type module.

The test question type module is signally connected with the control unit. The test question type module includes at least a test set for quality evaluation to determine whether a transformer is in a good or poor condition, each of the at least a test set includes a transformer electrically connected to a power source, a circuit diagram section for displaying a wiring status of the transformer, at least a status indicating lamp and at least a voltage value display. The transformer of the each of the at least a test set is applied with different voltages and wiring methods from another of the at least a test set. The circuit diagram section of the each of the at least a test set is drawn and disposed with a wiring configuration diagram corresponding to the transformer of the each of the at least a test set. The at least a status indicating lamp of the each of the at least a test set is disposed at a corresponding wiring position of the transformer in the circuit diagram section. The at least a voltage value display of the each of the at least a test set is disposed between different wiring connections of the transformer corresponding to the circuit diagram section in order to display a measured voltage between the different wiring connections.

The operating module is signally connected with the control unit. The operating module includes at least an answer selecting switch set corresponding to the at least a test set. Each of the at least an answer selecting switch set includes a normal switch and an abnormal switch. The operating module includes an initiating switch acting to start tests in the interactive test equipment. The operating module further includes a result judgment set. The result judgment set includes a result switch to initiate the interactive test equipment summarizing test results, a pass light and a fail light. The operating module includes a reset switch used to reset or load a new question type through the control unit.

The control unit is electrically connected with a power source to supply power to the interactive test equipment.

Accordingly, through physically fulfilling the above technical solutions, the interactive test equipment for quality evaluation of power transformers in accordance with the present invention is used to allow test subjects determining whether a transformer is in a good or poor condition through an interactive test method, and then to authenticate and evaluate a judgment ability of the test subjects in order for ensuring that the test subjects can instantly find out in time whether the transformer is normal or not when they work in a construction site so as to ensure safety of a working environment. As a result, practicality of the interactive test equipment can be effectively enhanced, added values of related products can be increased, and economic benefits of the interactive test equipment can be promoted.

Besides, the above objectives and effects of the present invention are further achieved through the following technical solution.

The test question type module can include five test sets. The five test sets include a test set with a three-phase three-wire voltage of 220V and a delta type wiring method for the transformer, a test set with three-phase four-wire voltages of 120V and 208V and a wye type wiring method for the transformer, a test set with three-phase four-wire voltages of 110V and 190V and a wye type wiring method for the transformer, a test set with single-phase three-wire voltages of 220V and 110V for two transformers in a serial connection, and a test set with a single-phase two-wire voltage of 110V for the transformer.

The each of the at least a test set of the test question type module includes at least a resistance value display respectively disposed between the different wiring connections of the transformer corresponding to the circuit diagram section in order to display a measured resistance between the different wiring connections.

The each of the at least a test set of the test question type module includes a measure insertion connective portion respectively disposed at every of wiring connective ends of the transformer corresponding to the circuit diagram section. The measure insertion connective portion is used to allow the test subjects directly measuring a corresponding actual voltage between the different wiring connections of the transformer via a multimeter.

An indicating light set is respectively disposed beside each of the at least an answer selecting switch set of the operating module. The indicating light set includes a normal light and an abnormal light respectively corresponding to the normal switch and the abnormal switch.

An action light is disposed beside the initiating switch of the operating module.

A reset light is disposed beside the reset switch of the operating module. The reset light is used to display an initiating action of the interactive test equipment to reset and load a new question type in the interactive test equipment.

The control unit is signally connected with a voice module in order to output reminding or alerting sounds or voices.

In order to enable the honorable Examiner to further understand constitutions, features and other objectives of the present invention, the following is exemplified to show several preferred embodiments of the present invention, and detailed descriptions thereof are provided hereinafter in cooperation with the drawings. At the same time, those who are familiar with the same technical field can physically practice the present invention accordingly.

DETAILED DESCRIPTION OF THE INVENTION

The present invention is related to an interactive test equipment for quality evaluation of power transformers. The following illustrations based on specified physical embodiments of the present invention are used to illustrate technical contents of the present invention so that the ordinarily skilled in the art can easily understand advantages and efficacy according to illustrated contents in the specification. Besides, the present invention can also be implemented or applied according to other different physical embodiments. In physical embodiments and components therein in accordance with the present invention illustrated in accompanying drawings, all references regarding designated sizes, front and back, left and right, a top portion and a bottom portion, an upper portion and a lower portion and a horizontal direction and a vertical direction are only used for convenient illustrations, and are not used to limit the present invention or limit components of the present invention in any position or spatial direction. The present invention can be varied according to designs and requirements of physical embodiments of the present invention without departing from the claimed scope of the present invention.

Figure 1:
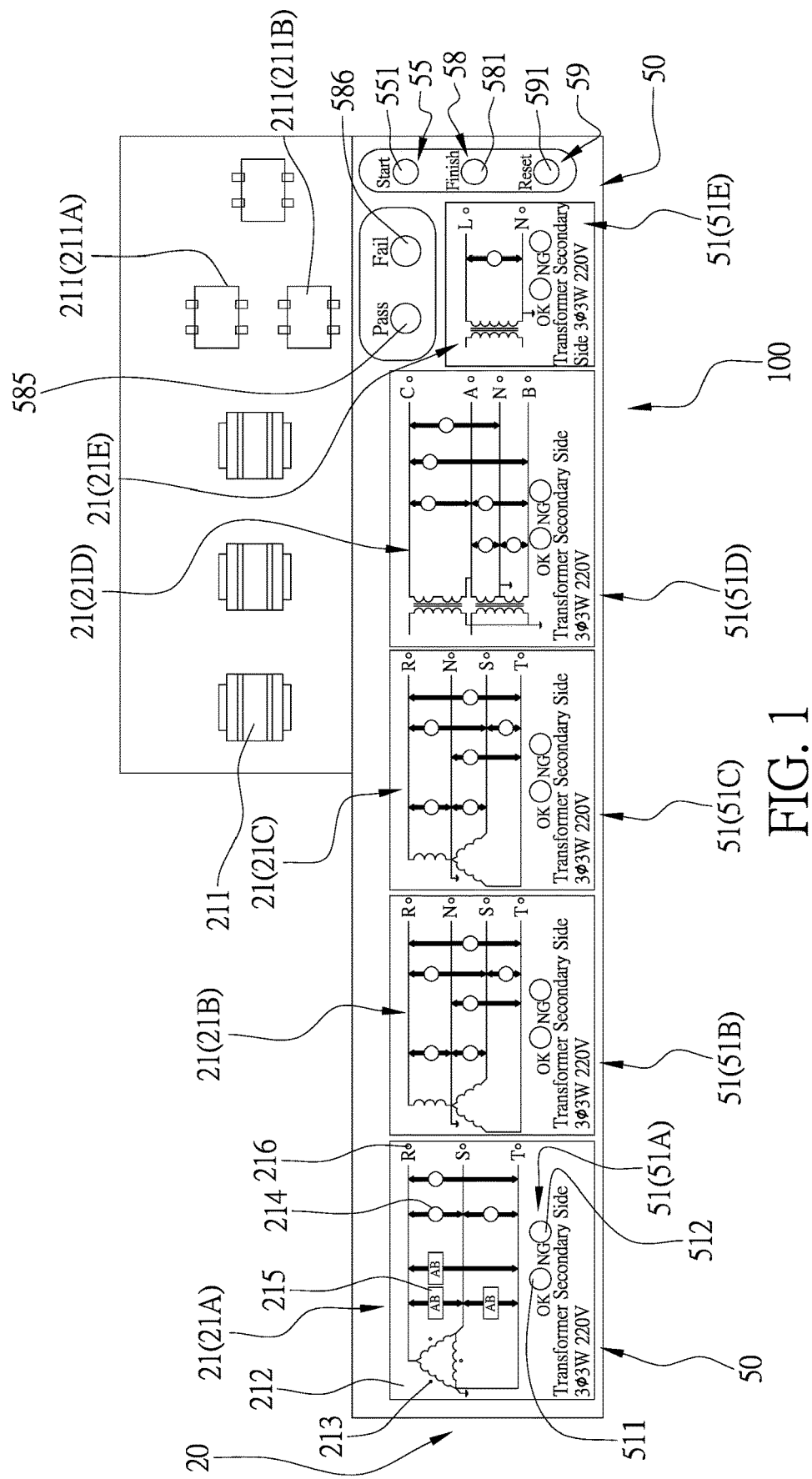
FIG. 1 shows a schematic test panel structural diagram of an interactive test equipment for quality evaluation of power transformers in accordance with a preferred embodiment of the present invention to illustrate a configuration of the interactive test equipment and an application thereof in tests in a using status of the interactive test equipment.
Figure 2:
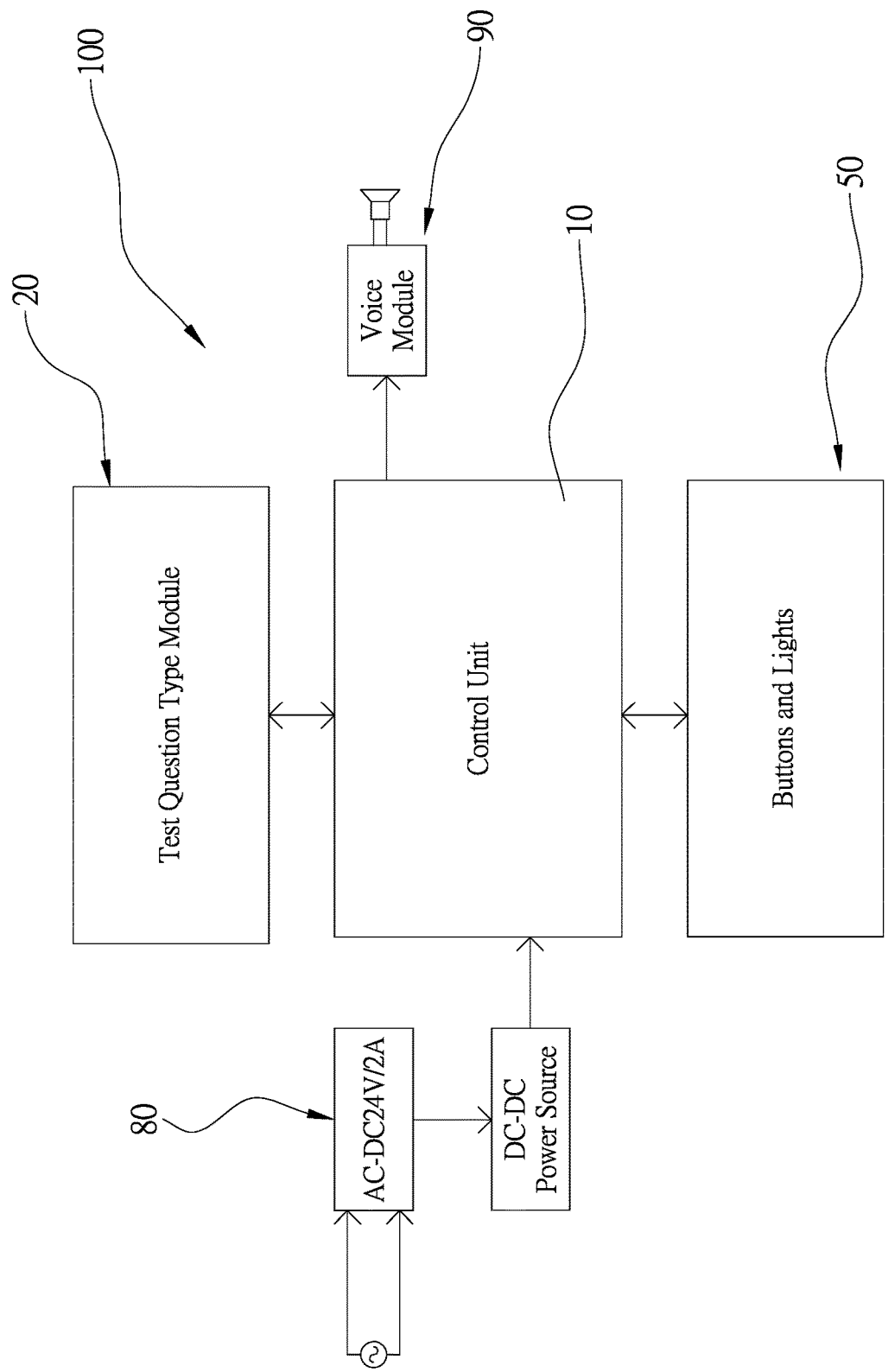
FIG. 2 shows a schematic circuit configuration diagram of the interactive test equipment for quality evaluation of power transformers in accordance with a preferred embodiment of the present invention.

Referring to FIGS. 1-2, a structure of an interactive test equipment for quality evaluation of power transformers in accordance with the present invention is provided and shown. The interactive test equipment is disposed on a platform 100 to include at least a control unit 10, a test question type module 20 and an operating module 50.

The control unit 10 is disposed to have data or instructions for processing, loading and outputting the test question type module 20 and the operating module 50. The control unit 10 is also disposed to save different question types in order to load the different question types in the test question type module 20.

Figure 3:
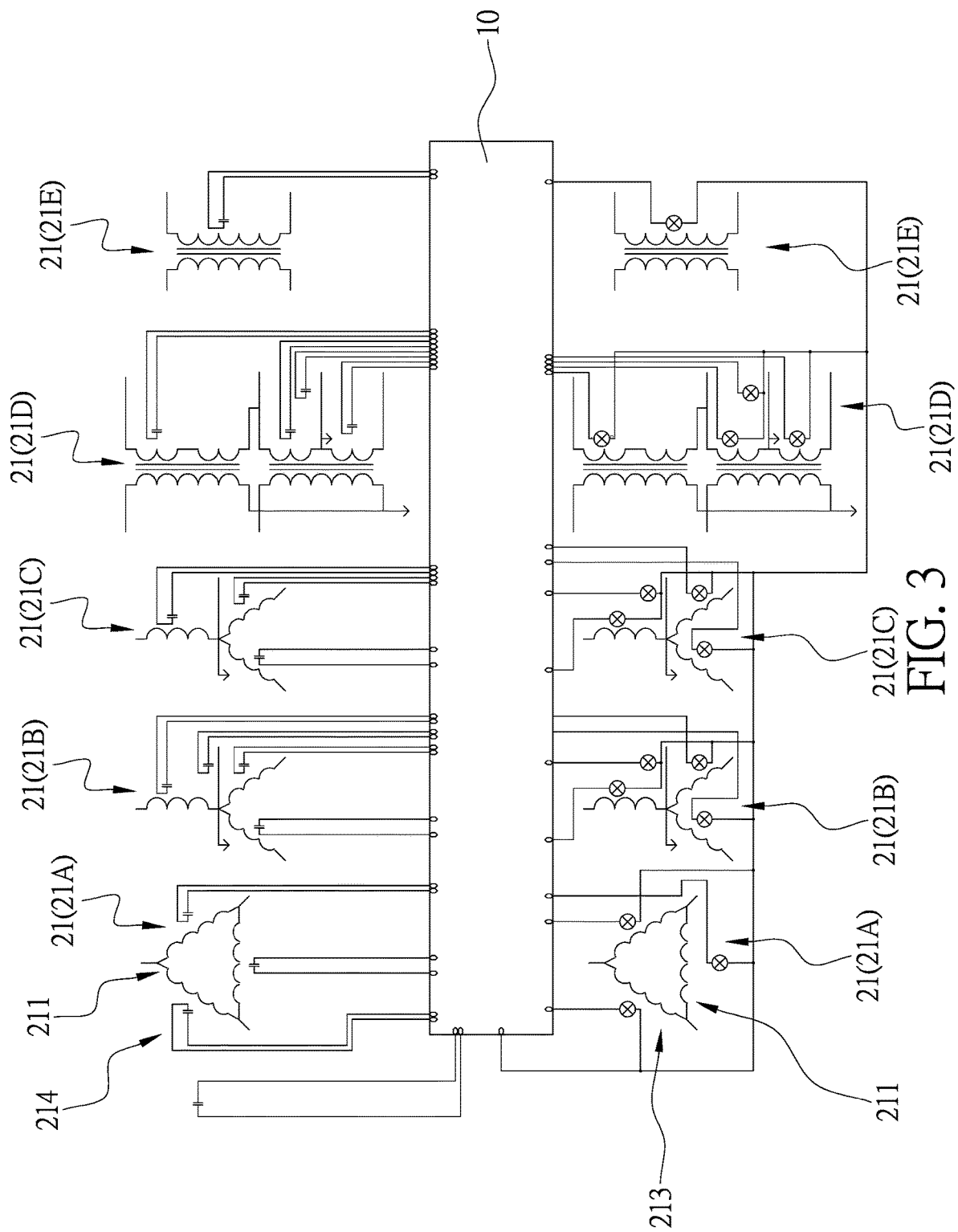
FIG. 3 shows a schematic wiring configuration diagram of a test question type module of the interactive test equipment for quality evaluation of power transformers in accordance with a preferred embodiment of the present invention.

The test question type module 20 is signally connected with the control unit 10. Further referring to FIG. 3, the test question type module 20 includes at least a test set 21 for quality evaluation to determine whether a transformer 211 is in a good or poor condition. Each of the at least a test set 21 has a transformer 211 electrically connected to a power source, a circuit diagram section 212 for displaying a wiring status of the transformer 211, at least a status indicating lamp 213 and at least a voltage value display 214. Besides, the each of the at least a test set 21 can be applied with different voltages and wiring methods. For example, five test sets 21 are disposed in a main embodiment in accordance with the present invention. The five test sets 21 include a test set 21A with a three-phase three-wire voltage of 220V and a delta (Δ) type wiring method for transformers 211 (Wiring branches of the delta type wiring method can be R, S, T), a test set 21B with three-phase four-wire voltages of 120V and 208V and a wye (Y) type wiring method for transformers 211 (Wiring branches of the wye type wiring method can be R, N, S, T), a test set 21C with three-phase four-wire voltages of 110V and 190V and a wye (Y) type wiring method for transformers 211 (Wiring branches of the wye type wiring method can be R, N, S, T), a test set 21D with single-phase three-wire voltages of 220V and 110V for two transformers 211A and 221B in a serial connection (Wiring branches thereof can be C, A, N, B), and a test set 21E with a single-phase two-wire voltage of 110V for transformers 211 (Wiring branches thereof can be L, N). The circuit diagram section 212 of each of the five test sets 21 is drawn and disposed with a wiring configuration diagram corresponding to the transformer 211 of the each of the five test sets 21 (i.e., 21A to 21E). The at least a status indicating lamp 213 of the each of the five test sets 21 (i.e., 21A to 21E) is disposed at a corresponding wiring position of a transformer 211 in the circuit diagram section 212 in order to indicate the wiring position of the transformer 211 being normal or abnormal. Besides, the at least a voltage value display 214 of the each of the five test sets 21 (i.e., 21A to 21E) is disposed between different wiring connections of the transformer 211 corresponding to the circuit diagram section 212 in order to display a measured voltage between the different wiring connections. In some embodiments in accordance with the present invention, the each of the five test sets 21 (i.e., 21A to 21E) has at least a resistance value display 215 respectively disposed between the different wiring connections of the transformer 211 corresponding to the circuit diagram section 212 in order to display a measured resistance between the different wiring connections, and to assist test subjects for further determining whether a corresponding transformer 211 is in a good or poor condition. Furthermore, according to some embodiments in accordance with the present invention, the each of the five test sets 21 (i.e., 21A to 21E) has a measure insertion connective portion 216 respectively disposed at every of wiring connective ends of the transformer 211 corresponding to the circuit diagram section 212. The measure insertion connective portion 216 can be an insertion hole or a pin for signally connecting with connective wires of the transformer 211, and is used to allow the test subjects directly measuring a corresponding actual voltage between the different wiring connections of the transformer 211 via a multimeter, and to assist the test subjects for further determining whether the corresponding transformer 211 is in a good or poor condition.

Figure 4:
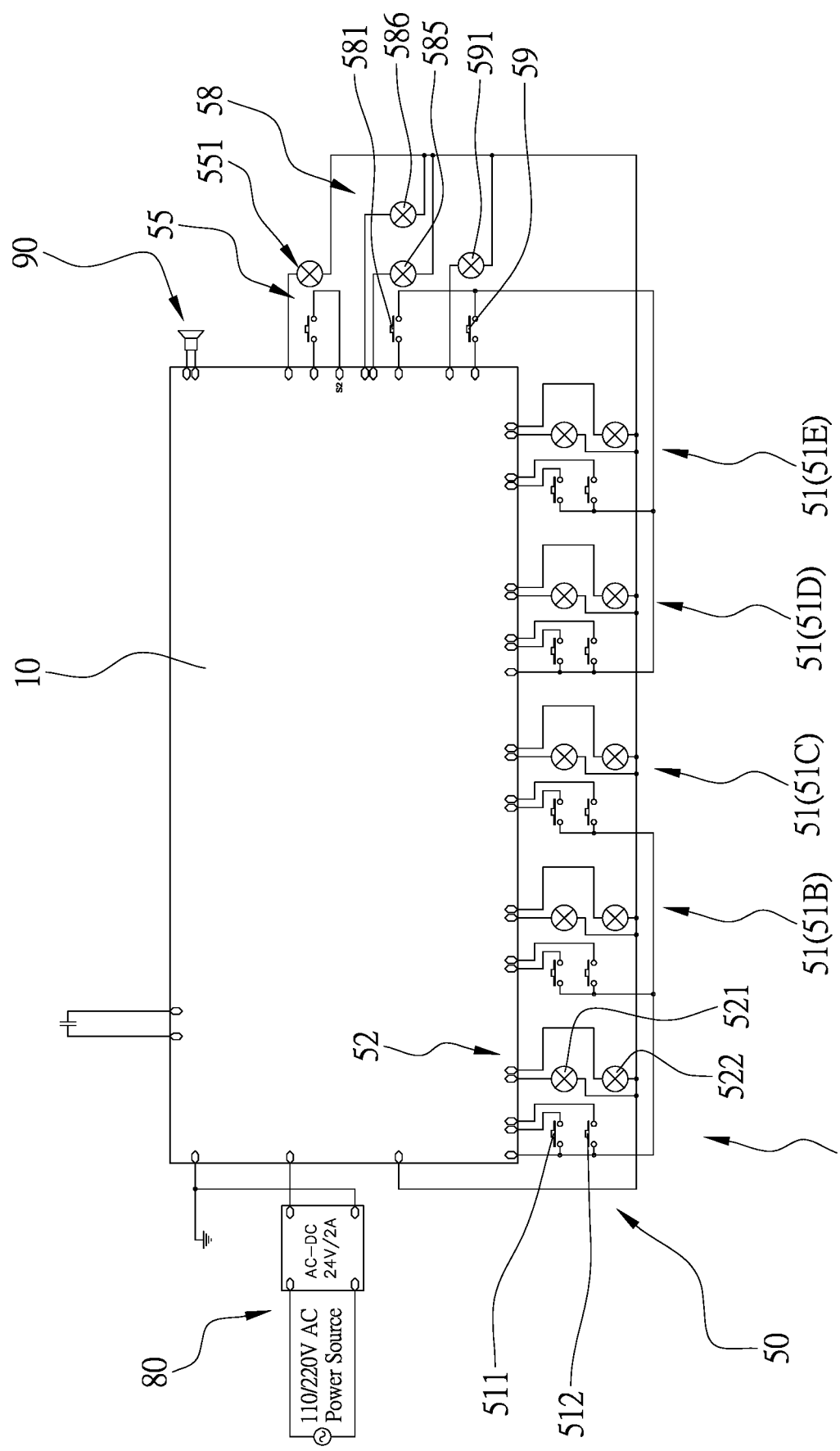
FIG. 4 shows a schematic wiring configuration diagram of an operating module of the interactive test equipment for quality evaluation of power transformers in accordance with a preferred embodiment of the present invention.

The operating module 50 is signally connected with the control unit 10. Further referring to FIG. 1 and FIG. 4, the operating module 50 includes at least an answer selecting switch set 51 corresponding to the at least a test set 21. Each of the at least an answer selecting switch set 51 has a normal switch 511 and an abnormal switch 512. The normal switch 511 and the abnormal switch 512 can be buttons. Five answer selecting switch sets 51 (i.e., 51A to 51E) corresponding to the five test sets 21 (i.e., 21A to 21E) are disposed in a main embodiment in accordance with the present invention. Each of the five answer selecting switch sets 51 is used for the test subjects to select answers via the normal switch 511 or the abnormal switch 512 based on voltage values between the different wiring connections of a corresponding transformer 211 displayed by the at least a voltage value display 214 of a corresponding one of the five test sets 21. According to some embodiments in accordance with the present invention, an indicating light set 52 is respectively disposed beside each of the at least an answer selecting switch set 51. The indicating light set 52 includes a normal light 521 and an abnormal light 522 respectively corresponding to the normal switch 511 and the abnormal switch 512 in order to display answers selected by the test subjects for facilitating confirmation from the test subjects and test supervisors. The operating module 50 includes an initiating switch 55 acting to start tests in the interactive test equipment. The initiating switch 55 can be a button. Further according to some embodiments in accordance with the present invention, an action light 551 is respectively disposed beside the initiating switch 55. The action light 551 is used to display the interactive test equipment is electrified to be initiated, and tests taken by the test subjects can be started. In addition, the operating module 50 further includes a result judgment set 58. The result judgment set 58 includes a result switch 581 to initiate the interactive test equipment summarizing test results, a pass light 585 and a fail light 586. The result switch 581 can be a button. Furthermore, the operating module 50 includes a reset switch 59. The reset switch 59 can be a button. The reset switch 59 is used to reset or load a new question type through the control unit 10 in order to start a next test cycle. Further according to some embodiments in accordance with the present invention, a reset light 591 is respectively disposed beside the reset switch 59. The reset light 591 is used to display an initiating action of the interactive test equipment to reset and load a new question type in the interactive test equipment.

The control unit 10 is electrically connected with a power source 80 to supply power to the control unit 10, the test question type module 20, the operating module 50 and the transformer 211 of the interactive test equipment. According to some embodiments in accordance with the present invention, the control unit 10 is further signally connected with a voice module 90 in order to output reminding or alerting sounds or voices.

Accordingly, the interactive test equipment for determining whether a power transformer 211 is in a good or poor condition in accordance with the present invention is constituted to allow test subjects proceeding their judgment whether the transformer 211 is in any disconnection or breakdown conditions through the interactive test equipment.

Figure 5:
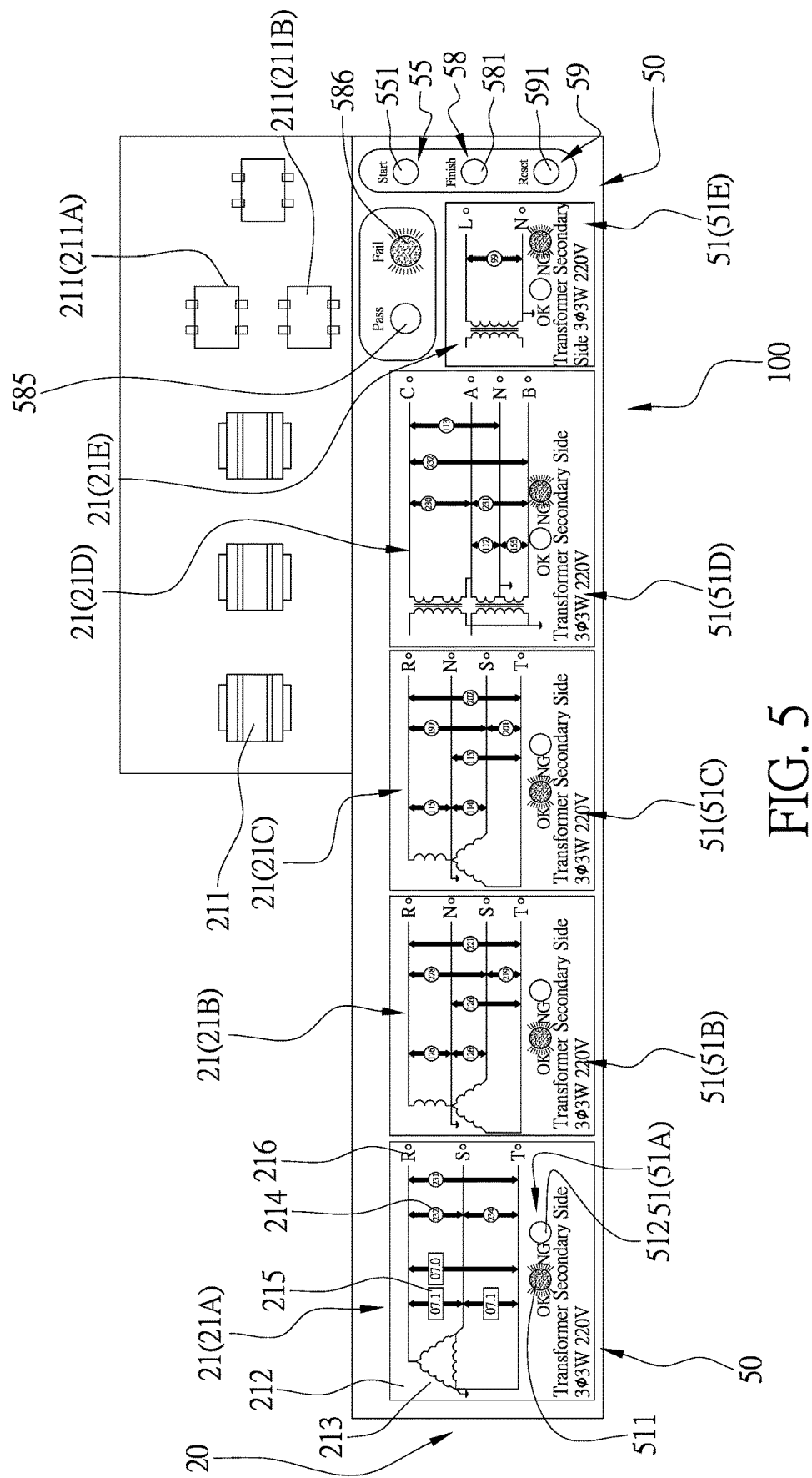
FIG. 5 shows a schematic using status diagram of the interactive test equipment for quality evaluation of power transformers in accordance with a preferred embodiment of the present invention to illustrate an actual using status during a test.
Figure 6:
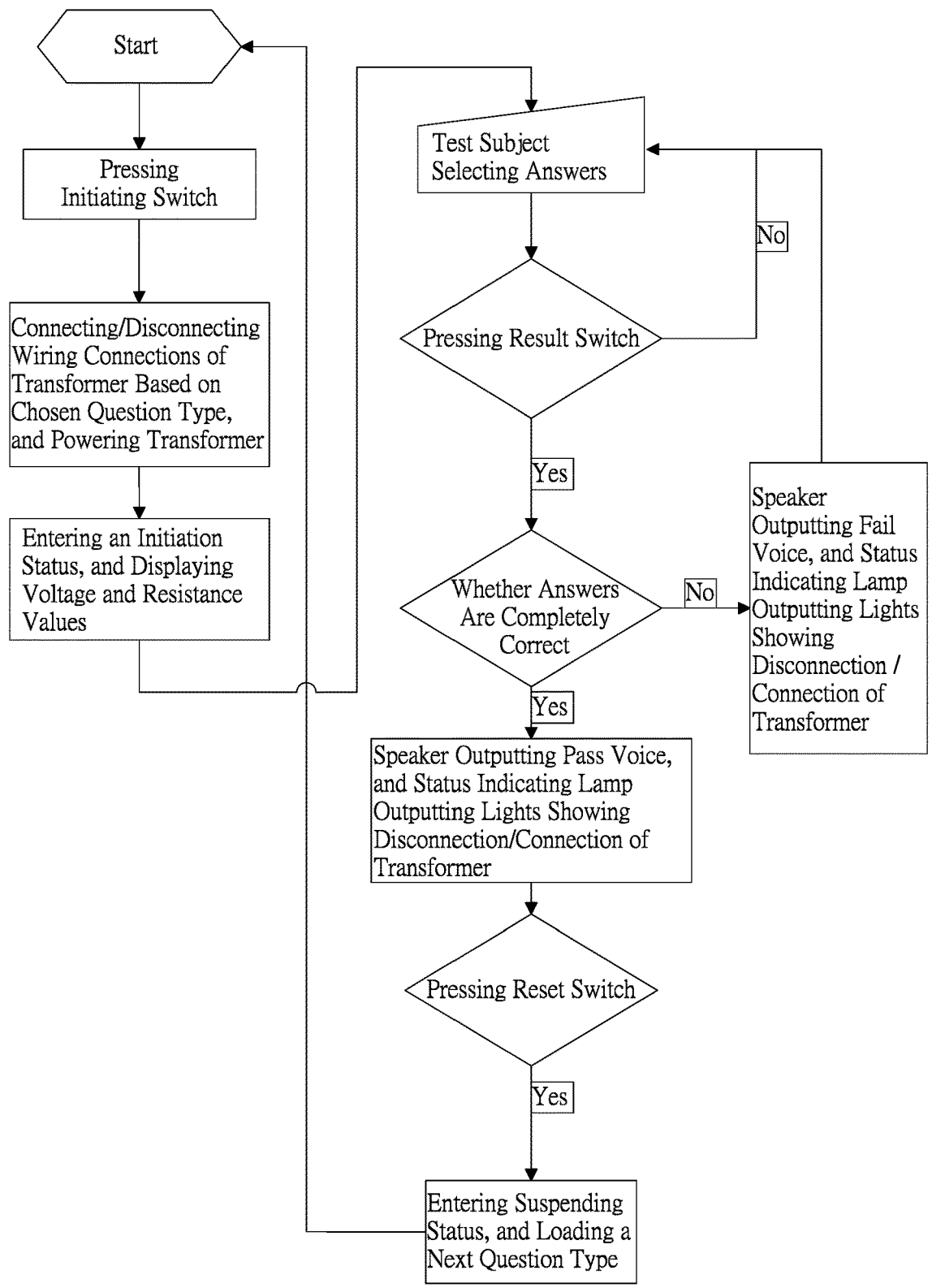
FIG. 6 shows a schematic test flow chart diagram of the interactive test equipment for quality evaluation of power transformers in accordance with a preferred embodiment of the present invention to illustrate testing steps.

Referring to FIGS. 5-6, actual test steps and processes for the interactive test equipment for quality evaluation of power transformers in accordance with the present invention are shown. In practice, a test subject presses the initiating switch 55 of the operating module 50 to power the interactive test equipment and to prepare the interactive test equipment being ready for the test subject so that the test subject can proceed through the interactive test equipment to determine whether wiring of the transformer 211 in the each of the at least a test set 21 of the test question type module 20 is in a good or poor condition. The control unit 10 accordingly electrically connects/disconnects wiring connections of the transformer 211 of the each of the at least a test set 21 based on a chosen question type, and powers the transformer 211. The interactive test equipment is then in an initiation status, and the voltage value display 214 and the resistance value display 215 respectively display corresponding electric voltage and resistance values of the transformer 211.

Subsequently, the test subject proceeds to select answers through the interactive test equipment. The test subject determines whether a corresponding transformer 211 is in a good or poor condition based on the displayed voltage values of the voltage value display 214 beside the transformer 211 of the test sets 21 (i.e., 21A to 21E), and presses the answer selecting switch sets 51 (i.e., 51A to 51E) of the operating module 50 corresponding to the test sets 21 (i.e., 21A to 21E) based on the determined answers, i.e., presses a corresponding normal switch 511 or abnormal switch 512 of the answer selecting switch sets 51 (i.e., 51A to 51E) based on the determined answers. Afterwards, the result switch 581 of the operating module 50 is pressed by the test subject. When the control unit 10 determines answers selected by the test subject on the answer selecting switch sets 51 (i.e., 51A to 51E) for all of the test sets 21 (i.e., 21A to 21E) are not completely correct, the voice module 90 outputs a fail voice, and the status indicating lamp 213 of every one of the test sets 21 (i.e., 21A to 21E) with a wrong answer on the transformer 211 thereof twinkles to display a corresponding normal or abnormal signal for the transformer 211. The test subject retakes the test and answers based on the above method and steps.

On the contrary, when the control unit 10 determines answers selected by the test subject on the answer selecting switch sets 51 (i.e., 51A to 51E) for all of the test sets 21 (i.e., 21A to 21E) are completely correct, the voice module 90 outputs a pass voice, and the reset switch 59 can be pressed so that the interactive test equipment enters a suspending status. After the control unit 10 loads a new question type for all of the test sets 21 (i.e., 21A to 21E) of the test question type module 20, the test for different test subjects to determine whether a corresponding transformer 211 is in a good or poor condition can be repeatedly proceeded.

Based on the above illustrations, the interactive test equipment for quality evaluation of power transformers in accordance with the present invention is disposed on a platform 100 to include the at least a control unit 10, the test question type module 20 and the operating module 50, and the at least a control unit 10, the test question type module 20 and the operating module 50 are signally connected. The test question type module 20 includes at least a test set 21, and each of the at least a test set 21 has the transformer 211, the at least a voltage value display 214 and the at least a resistance value display 215. Based on the above design, the at least a voltage value display 214 and the at least a resistance value display 215 of the each of the five test sets 21 (i.e., 21A to 21E) can display a measured voltage value and a measured resistance value of a corresponding transformer 211. Test subjects can initiate the interactive test equipment and select answers through the operating module 50, and load questions and determine answers through the control unit 10. As a result, the interactive test equipment is used to allow test subjects determining whether a transformer is in a good or poor condition through an interactive test method, and then to authenticate and evaluate a judgment ability of the test subjects in order to ensure safety of a working environment.

Accordingly, it can be understood that the present invention is an extremely creative invention. In addition to effectively solving problems faced by the ordinarily skilled in the art, the present invention is also configured to greatly improve efficacy. Besides, no identical or similar product in the same technical field can be found to be invented or in public use, and the present invention has enhanced advantages simultaneously. Therefore, the present invention meets requirements of "novelty" and "non-obviousness" as stipulated for utility patent applications in the patent law, and a patent application for the present invention is filed in accordance with the patent law.

What is claimed is:

1. An interactive test equipment for quality evaluation of power transformers, being disposed on a platform, and comprising at least a control unit, a test question type module and an operating module; wherein the control unit is disposed to have data and instructions for processing the test question type module and the operating module, and to save different question types in order to load the different question types in the test question type module;

the test question type module is signally connected with the control unit, the test question type module comprises at least a test set for quality evaluation to determine whether a transformer is in a good or poor condition, each of the at least a test set comprises a transformer electrically connected to a power source, a circuit diagram section for displaying a wiring status of the transformer, at least a status indicating lamp and at least a voltage value display, the transformer of the each of the at least a test set is applied with different voltages and wiring methods from another of the at least a test set, the circuit diagram section of the each of the at least a test set is drawn and disposed with a wiring configuration diagram corresponding to the transformer of the each of the at least a test set, the at least a status indicating lamp of the each of the at least a test set is disposed at a corresponding wiring position of the transformer in the circuit diagram section, the at least a voltage value display of the each of the at least a test set is disposed between different wiring connections of the transformer corresponding to the circuit diagram section in order to display a measured voltage between the different wiring connections;

the operating module is signally connected with the control unit, the operating module comprises at least an answer selecting switch set corresponding to the at least a test set, each of the at least an answer selecting switch set comprises a normal switch and an abnormal switch, the operating module comprises an initiating switch acting to start tests in the interactive test equipment, the operating module further comprises a result judgment set, the result judgment set comprises a result switch to initiate the interactive test equipment summarizing test results, a pass light and a fail light, the operating module comprises a reset switch used to reset or load a new question type through the control unit;

the control unit is electrically connected with a power source to supply power to the interactive test equipment;

the interactive test equipment for determining whether a power transformer is in a good or poor condition is constituted to allow test subjects proceeding judgment thereof whether the transformer is in any disconnection or breakdown conditions through the interactive test equipment.

2. The interactive test equipment for quality evaluation of power transformers as claimed in claim 1, wherein the test question type module comprises five test sets, comprising a test set with a three-phase three-wire voltage of 220V and a delta type wiring method for the transformer, a test set with three-phase four-wire voltages of 120V and 208V and a wye type wiring method for the transformer, a test set with three-phase four-wire voltages of 110V and 190V and a wye type wiring method for the transformer, a test set with single-phase three-wire voltages of 220V and 110V for two transformers in a serial connection, and a test set with a single-phase two-wire voltage of 110V for the transformer.

3. The interactive test equipment for quality evaluation of power transformers as claimed in claim 1, wherein the each of the at least a test set of the test question type module comprises at least a resistance value display respectively disposed between the different wiring connections of the transformer corresponding to the circuit diagram section in order to display a measured resistance between the different wiring connections.

4. The interactive test equipment for quality evaluation of power transformers as claimed in claim 1, wherein the each of the at least a test set of the test question type module comprises a measure insertion connective portion respectively disposed at every of wiring connective ends of the transformer corresponding to the circuit diagram section, the measure insertion connective portion is used to allow the test subjects directly measuring a corresponding actual voltage between the different wiring connections of the transformer via a multimeter.

5. The interactive test equipment for quality evaluation of power transformers as claimed in claim 2, wherein the each of the five test sets of the test question type module comprises a measure insertion connective portion respectively disposed at every of wiring connective ends of the transformer corresponding to the circuit diagram section, the measure insertion connective portion is used to allow the test subjects directly measuring a corresponding actual voltage between the different wiring connections of the transformer via a multimeter.

6. The interactive test equipment for quality evaluation of power transformers as claimed in claim 1, wherein an indicating light set is respectively disposed beside each of the at least an answer selecting switch set of the operating module, the indicating light set comprises a normal light and an abnormal light respectively corresponding to the normal switch and the abnormal switch.

7. The interactive test equipment for quality evaluation of power transformers as claimed in claim 1, wherein an action light is disposed beside the initiating switch of the operating module.

8. The interactive test equipment for quality evaluation of power transformers as claimed in claim 1, wherein a reset light is disposed beside the reset switch of the operating module, the reset light is used to display an initiating action of the interactive test equipment to reset and load a new question type in the interactive test equipment.

9. The interactive test equipment for quality evaluation of power transformers as claimed in claim 1, wherein the control unit is signally connected with a voice module in order to output reminding or alerting sounds or voices.

* * * * *